(12) United States Patent
Extrand et al.

(10) Patent No.: US 8,012,586 B2
(45) Date of Patent: Sep. 6, 2011

(54) DIAMOND LIKE CARBON COATING OF SUBSTRATE HOUSINGS

(75) Inventors: Charles W. Extrand, Minneapolis, MN (US); Sung In Moon, Chaska, MN (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 12/515,606

(22) PCT Filed: Jun. 14, 2007

(86) PCT No.: PCT/US2007/013909
§ 371 (c)(1),
(2), (4) Date: Jun. 9, 2009

(87) PCT Pub. No.: WO2008/063241
PCT Pub. Date: May 29, 2008

(65) Prior Publication Data
US 2010/0017346 A1    Jan. 21, 2010

Related U.S. Application Data

(60) Provisional application No. 60/860,837, filed on Nov. 22, 2006.

(51) Int. Cl.
*B09B 3/00* (2006.01)
*H01L 23/58* (2006.01)
(52) U.S. Cl. ...................... 428/408; 257/642
(58) Field of Classification Search ............ 428/408; 257/642
See application file for complete search history.

(56) References Cited

U.S. PATENT DOCUMENTS

| 5,255,789 | A | 10/1993 | Janssens et al. |
| 5,569,501 | A * | 10/1996 | Bailey et al. ............... 427/577 |
| 5,580,429 | A | 12/1996 | Chan et al. |
| 5,728,465 | A | 3/1998 | Dorfman et al. |
| 6,045,916 | A * | 4/2000 | Shimamura et al. ......... 428/408 |
| 6,338,409 | B1 | 1/2002 | Neary |
| 6,338,881 | B1 | 1/2002 | Sellschopp et al. |
| 6,395,333 | B2 * | 5/2002 | Veerasamy ............. 427/249.7 |
| 6,498,619 | B1 | 12/2002 | Yanagi |
| 6,805,931 | B2 * | 10/2004 | Nagashima ............... 428/36.6 |
| 2002/0129021 | A1 | 9/2002 | Brown |
| 2005/0107870 | A1 | 5/2005 | Wang et al. |

OTHER PUBLICATIONS

Written Opinion, PCT/US2007/013909, dated Nov. 19, 2007.
International Search Report, PCT/US2007/013909, date of mailing Nov. 19, 2007.
International Preliminary Report on Patentability, PCT/US2007/013909, date of issuance May 26, 2009.

* cited by examiner

*Primary Examiner* — Cathy Lam
(74) *Attorney, Agent, or Firm* — Hamilton, Brook, Smith & Reynolds, P.C.

(57) ABSTRACT

Embodiments of the invention include articles comprising a diamond like carbon coating or doped diamond like carbon coating on one or more surfaces of a plastic substrate or a plastic enclosure. Embodiments of the DLC or doped DLC coatings reduce the gas permeation of the coated plastic or thermoplastic to hydrogen or helium compared to the permeability of the plastic alone. The DLC or doped DLC coatings coating provides a surface resistivity of from about $10^7$ to about $10^{14}$ ohm/square and have a transmittance that range from about 0% to about 70% less than the transmittance of the underlying plastic substrate in the range of about 300 nm to about 1100 nm. The DLC coated plastic can be used in environmental enclosures for protecting environmentally sensitive substrates such as semiconductor wafers and reticles.

9 Claims, 9 Drawing Sheets

DIAMOND LIKE CARBON COATING OF SUBSTRATE HOUSINGS

CROSS REFERENCE TO RELATED APPLICATIONS

This application is the U.S. National Stage of International Application No. PCT/US2007/013909, filed on Jun. 14, 2007, published in English, which claims the benefit of U.S. Provisional Application No. 60/860,837, filed Nov. 22, 2006. The entire teachings of the above application(s) are incorporated herein by reference.

BACKGROUND

Diamond like carbon coatings have a number of unique properties such as low friction coefficient, high surface hardness and high wear resistance. They have been used in a number of high wear applications such as bearings, medical appliances, as well as food and beverage containers.

SUMMARY

Embodiments of the present invention include diamond like carbon coatings (DLC), doped DLC coatings, or combinations including these on plastics that can be made into storage containers to protect environmentally sensitive substrates. Such coatings can provide a combination of protection from electro-static discharge (ESD), sufficient transparency to enable a user identify the contents of the container, and gas barrier properties that protect the substrates from contamination in the ambient environment or outgassing from the container materials of construction. In some embodiments the diamond like carbon coating or the doped diamond like carbon coating can be further modified reduce the contact angle and increase wettability (hydrophilic property) of the diamond like coating; the contact angle is lower than that for the starting DLC or doped DLC coating. Improved hydrophilicity is desirable for cleaning of containers with these DLC coatings. In some embodiments the dopant in the DLC coating is oxygen, nitrogen, or any combination of these.

Embodiments of the invention include articles comprising a diamond like carbon coating on one or more surfaces of a plastic substrate or a plastic enclosure. Embodiments of the DLC or doped DLC coatings can reduce the gas permeation of the coated plastic or thermoplastic to hydrogen or helium by more than 10 times compared to the permeability of the plastic alone, and the coating provides a surface resistivity of from about $10^7$ to about $10^{12}$ ohm/square and has a transmittance that ranges from about 0% to about 70% less than the transmittance of the underlying plastic substrate for light in the range of about 300 nm to about 1100 nm. Other embodiments of the invention can comprise or consist of a substrate enclosure having at least one diamond like carbon or doped diamond like carbon coated surface on a thermoplastic of the enclosure. The diamond like carbon or doped diamond like carbon coated surface has a surface resistivity in the range of from $10^7$ ohm per square to $10^{14}$ ohm per square and a percent transmittance that is at least 70% of the thermoplastic from 300 nm to 1100 nm, and a gas permeation coefficient for helium of 0.59 Barrers or less. Still other embodiments can be an article comprising or consisting of a plastic or thermoplastic and an adherent diamond like carbon coating on one or more surfaces of the plastic or thermoplastic. The adherent diamond like carbon coating has a permeability coefficient for helium gas that is at least 10 times less than the permeability coefficient for helium of the plastic or thermoplastic. The diamond like carbon coating has a surface resistivity of from about $10^7$ to about $10^{14}$ ohm/square and the adherent diamond like carbon coating has a transmittance that is 0% to 70% less than the transmittance of the plastic or thermoplastic to light in the range of 300 nm to 1100 nm.

In some embodiments, the diamond like carbon coating comprises or includes a doped diamond like carbon on one or more surfaces of a polymeric or a thermoplastic substrate where the substrate can be used to make an enclosure for environmentally sensitive substrates. In other embodiments a molded enclosure or portions of it used for protecting one or more environmentally sensitive substrate(s) can be coated with diamond like carbon coating or doped diamond like carbon coating of the present invention. Such a coating reduces the gas permeation of the enclosure to gases from the environment or contaminants from the plastic used to make the enclosure. The coating can reduce the permeability of the underlying substrate to hydrogen gas by more than 100 times and the coating can provides a surface resistivity of about $10^7$ to about $10^{12}$ ohm/square and has a transmittance that ranges from about 0% to about 70% less than the transmittance of the underlying plastic substrate for light in the range of about 300 nm to about 1100 nm.

The doped diamond like carbon coating on plastic material in embodiments of the present invention can comprise carbon, oxygen, nitrogen, or a combination that includes any of these that have a transmittance that ranges from about 0% to about 70% less than the transmittance of the underlying plastic substrate for light in the range of about 300 nm to about 1100 nm and where the surface resistivity of the doped diamond like carbon is in the range of from about $10^7$ ohm per square to about $10^{14}$ ohm per square; and in other embodiments from about $10^8$ ohm per square to about $10^{12}$ ohm per square; and in still other embodiments from about $10^9$ ohm per square to about $10^{12}$ ohm per square. In some embodiments, the coating is uniform and the variation of surface resistivity from one portion of the DLC or doped DLC coated plastic is less than about $10^2$ ohm per square and in some cases less than $10^1$ ohm per square over the coated surface. Such coating uniformity is advantageous because it can eliminate insulating spots from the coated plastic. Embodiments of the diamond like coating or doped diamond like carbon coating in embodiments of the invention have lower gas permeation coefficients compared to diamond like carbon on plastics reported in U.S. Pat. No. 6,805,931. In some embodiments of the invention the amount of nitrogen, oxygen, or a combination of these in the doped diamond like carbon coatings on a plastic substrate can be chosen to provide a permeation coefficient for hydrogen or helium gas of 0.59 Barrers to 0.03 Barrers, or in some embodiments a permeation coefficient of from 0.15 Barrers to 0.03 Barrers. In some embodiments of the invention the amount of nitrogen, oxygen, or a combination of these in the doped diamond like carbon coatings on a plastic substrate can be chosen to provide a permeation coefficient for hydrogen or helium gas of 0.12 Barrers or less, or in some embodiments a permeation coefficient of 0.06 Barrers or less, and in still other embodiments a permeation coefficient of 0.03 Barrers or less. The thickness and composition of the DLC or doped DLC coating is not limited and can chosen to provide a permeation coefficient, percent transmittance to light, a surface resistivity, a surface resistivity uniformity or any combination of these as described herein. In some embodiments the coating thickness can be less than 1 micron, in other embodiments 250 nm or less, in other embodiments 120 nm or less, and in still other embodiments 70 nm or less.

In one embodiment of the invention, the substrate or portion of an enclosure with the diamond like carbon or doped diamond like carbon coating in various embodiments of the invention may be characterized in that the XPS spectra of the diamond like carbon film in embodiments of the invention has a carbon peak, an oxygen peak and a nitrogen peak. In some embodiments, the XPS spectrum has a carbon peak at about 284 eV, an oxygen peak at about 532 eV, and a nitrogen peak at about 399 eV.

The plastic substrate or one or more surfaces of a plastic enclosure coated with diamond like carbon or doped diamond like carbon in various embodiments of the invention can further be treated. For example treatment can include but is not limited to treatment by a plasma, a reactive gas containing plasma, or corona discharge, an oxygen containing plasma, or other method to further modify the coating to make it more hydrophilic. The one or more DLC or doped DLC coated surfaces of an enclosure can be or form any part of a substrate carrier such as but not limited to a carrier for wafers, a carrier for flat panel displays, or a carrier for lithographic reticles, or a carrier for other environmentally sensitive substrates. The enclosure can provide protection from electrostatic discharge, environmental gases, particles, outgassing species from enclosure materials of construction, or any combination that includes these. The DLC or doped DLC coating may be also be used to reduce electrostatic discharge (ESD) such as in substrate carriers or fluid handling equipment in contact with flammable liquids such as organic liquids used in semiconductor wafer manufacturing, pharmaceutical manufacturing, or fine chemical manufacturing. Such fluid handling equipment can include conduits and tubing, flow meters and controllers and surfaces therein, dispense nozzles, heat exchangers, fluid filters, or transducer surfaces and the like.

One embodiment of the invention includes the acts or steps of determining a customer's need for environmental protection of sensitive substrates such as a semiconductor wafer, a reticle, or flat panel display, and providing an enclosure to the customer with specified properties that can separately include electrostatic discharge protection, transparency, gas permeation or outgassing resistance. In some embodiments a combination of properties can be used to determine the type of enclosure to be provided or sold to the customer, such properties can include any combination of ESD protection (surface resistivity), transparency or transmittance of light, gas permeability coefficient, or any combination of properties including these.

One embodiment of the invention can include method comprising selling an enclosure having at least one diamond like carbon or doped DLC coated surface with a surface resistivity in the range of from about $10^7$ ohm per square to about $10^{12}$ ohm per square and a % transmittance that is 0% to 70% of the underlying substrate in the visible or UV spectrum, and a permeation coefficient for hydrogen or helium of 0.59 Barrers to 0.03 Barrers or less, or from 0.15 Barrers to 0.03 Barrers or less for a coating on both sides of a polymeric substrate. The method can further include making the enclosures, testing them for permeation, ESD, transmission, or any combination of these and sorting the enclosures based on the testing criteria. The sorted enclosures can be sold based on their ESD properties or any combination of these properties. In some embodiments, the method can further include coating the portions of the enclosure in one or more coating operations to further modify the properties of the coating.

Another method includes determining client requirements for protecting a substrate that can include the ESD or surface resistivity, percent transmittance, gas permeability, or any combination of these. The method can further include the step of contacting a central server/database to input the information for the client's requirements, and coating the housings with a doped diamond like coating to meet the client requirements. The method can further include the step of determining a price for the housings and providing the client with a price and time for delivery.

BRIEF DESCRIPTION OF THE DRAWINGS

FIG. 1 is an illustration of diamond like carbon in an embodiment of the invention coated on both sides of a 10 mil PC sample, the diamond like carbon has a coating thickness of 120 nm on each side of the PC sample.

FIG. 3A illustrate the C 1s peak in the XPS spectra for the untreated DLC coating on a polycarbonate film shown in FIG. 2A, the C 1s peak is centered at about 284 eV and the peak envelope ranges from 282 eV to 286 eV; FIG. 3B illustrate the O 1s peak in the XPS spectra for the untreated DLC coating on a polycarbonate film shown in FIG. 2A, the O 1s peak is centered at about 532 eV and the peak envelope ranges from 530 eV to 534 eV; FIG. 3C illustrate the C 1s peak in the XPS spectra for the plasma treated DLC coating on a polycarbonate film shown in FIG. 2B, the C 1s peak is centered at about 285 eV and the peak envelope ranges from 283 eV to 290 eV; FIG. 3D illustrate the O 1s peak in the XPS spectra for the plasma treated DLC coating on a polycarbonate film shown in FIG. 2B, the O 1s peak is centered at about 533 eV and the peak envelope ranges from 530 eV to 535 eV.

DETAILED DESCRIPTION

Before the present compositions and methods are described, it is to be understood that this invention is not limited to the particular molecules, compositions, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to a "coating layer" is a reference to one or more coating layers and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of embodiments of the present invention. All publications mentioned herein are incorporated by reference. Nothing herein is to be construed as an admission that the invention is not entitled to antedate such disclosure by virtue of prior invention.

"Optional" or "optionally" means that the subsequently described event or circumstance may or may not occur, and that the description includes instances where the event occurs and instances where it does not. For example, the diamond like carbon coating on a plastic portion of an enclosure may include instances where the coating is doped, is not doped, or includes a combination of doped diamond like carbon and diamond like carbon layers.

Figure 1A:
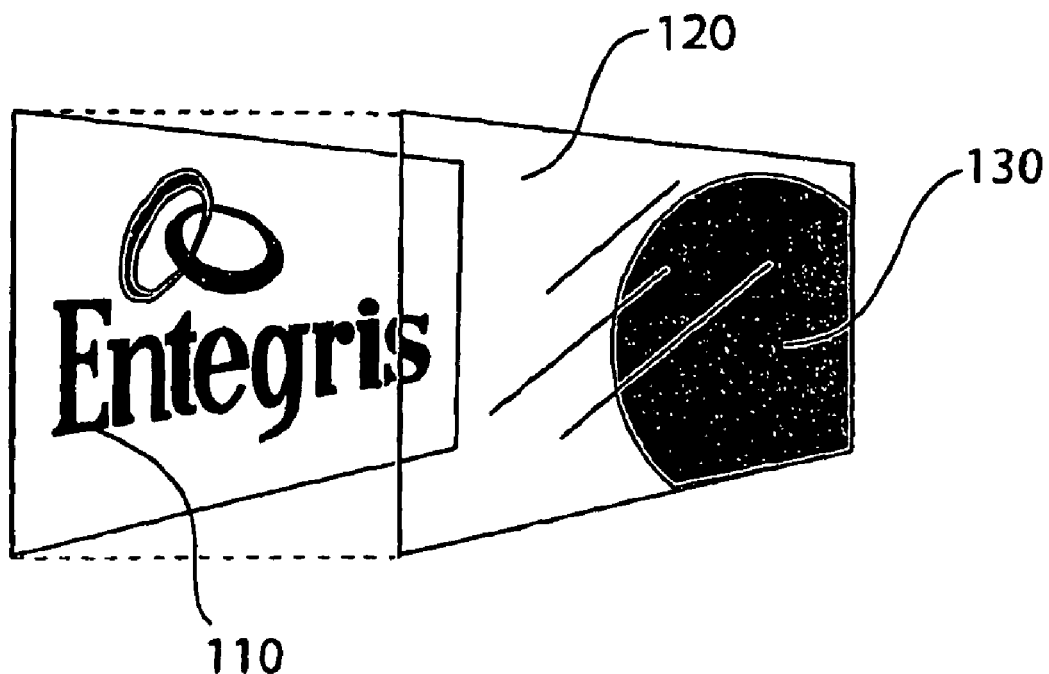
FIG. 1A is an exploded view illustrating a plastic film (120) with a region of a transparent and adherent diamond like carbon coating (130) in an embodiment of the invention, the plastic film (120) is shown overlaying text (110) on a piece of paper.
Figure 1B:
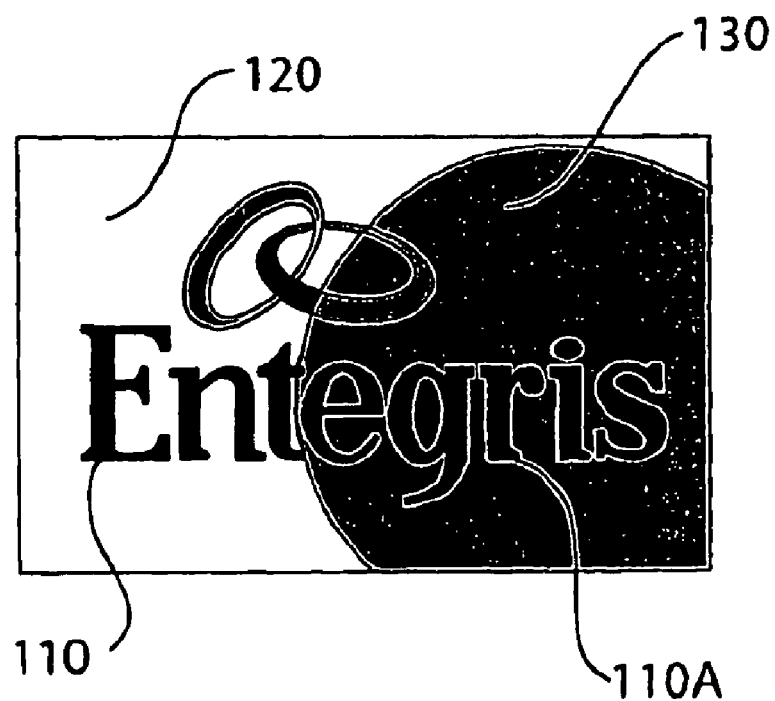
FIG. 1B illustrates a top down view of FIG. 1A through the film (120) illustrating that a portion of the text (110A) beneath the region of diamond like carbon coating (130) on the plastic film (120) is visible through the transparent diamond like carbon coating (130).
Figure 5:
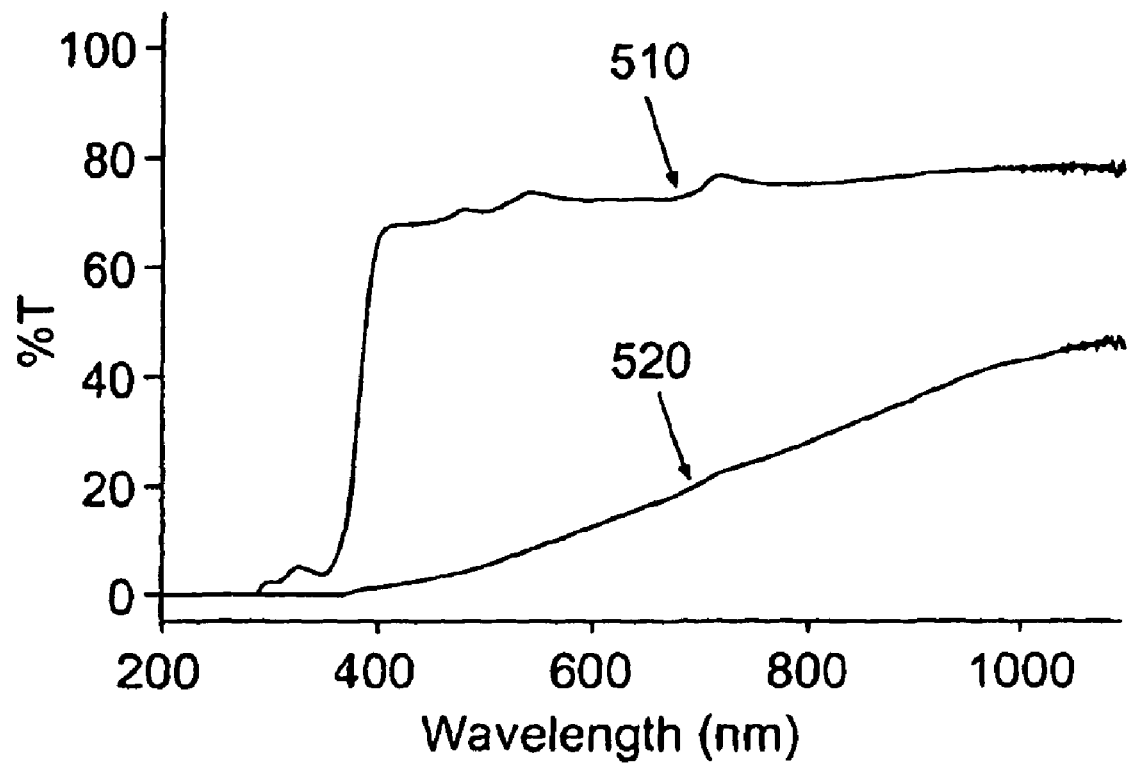
FIG. 5 is a UV-VIS spectrum of a sample of polycarbonate film (510) and a sample of polycarbonate film with about 120 nm diamond like carbon coating on each side of a polycarbonate film (520) in an embodiment of the invention from FIG. 1.

FIG. 1 is an illustration of a film in an embodiment of the invention with a transparent diamond like carbon coating (130) of 120 nm thickness applied to both sides of a 10 mil thick polycarbonate substrate (120); the film had a surface resistivity of about $10^{11}$ ohm/square. The UV-VIS spectrum from about 300 nm to 1100 nm of this diamond like carbon coating on the 10 mil thick PC (520) and the uncoated polycarbonate film (510) is shown in FIG. 5. As shown in FIG. 5, at about 300 nm the polycarbonate film (510) had a percent transmittance of about 3% and the DLC coated polycarbonate (520) had a transmittance of about 0%—the diamond like carbon coated substrate had a transmittance that was nearly the same or 0% less than the uncoated polycarbonate plastic; at about 400 nm the polycarbonate film (510) had a percent transmittance of about 70% and the DLC coated polycarbonate (520) had a transmittance of about 2%—the diamond like carbon coated substrate (520) had a transmittance that was nearly 70% less than the uncoated polycarbonate plastic (510); at about 600 nm the polycarbonate film (510) had a percent transmittance of about 72% and the DLC coated polycarbonate (520) had a transmittance of about 10%; the coated substrate (520) had a transmittance that was about 60% less than the uncoated polycarbonate plastic (510); at a wavelength of about 700 nm the polycarbonate film (510) had a percent transmittance of about 77% and the DLC coated polycarbonate (520) had a transmittance of about 38%; the coated substrate (520) had a transmittance that was about 40% less than the uncoated polycarbonate plastic (510); at a wavelength at about 1100 nm the polycarbonate film (510) had a percent transmittance of about 80% and the DLC coated polycarbonate (520) had a transmittance of about 45%; the coated substrate (520) had a transmittance that was about 35% less than the uncoated polycarbonate plastic (510). This doped diamond like carbon coated plastic substrate (520) is characterized by the XPS spectra in FIG. 2A (untreated), and has a transmittance that ranges from about 0% to about 70% less than the transmittance of the underlying plastic substrate in the range of about 300 nm to about 1100 nm. The transmittance of the coated sample (520) in FIG. 5 increases linearly between about 500 nm and about 900 nm. The low transmission in the UV portion of the spectrum, especially below about 400 nm to 500 nm is advantageous because for example, it can prevent or reduce the amount of UV light that contacts an environmentally sensitive surface enclosed by a carrier coated with this diamond like carbon coating. UV light can damage sensitive surfaces and can cause reactions to occur on environmentally sensitive surfaces. Such reactions can cause thin film damage. As shown in FIG. 1, the coating is sufficiently transparent to view text through the coated film.

A variety of plastic substrates can be DLC coated, doped diamond like carbon coated, or coated with a combination of these coatings. For example polycarbonate substrates can be coated and their surface resistivities could be controlled by doping the coating. The doped diamond like carbon and the coating was very pure with respect to outgassing, extractable metals, extractable anions. The doped diamond like carbons in embodiments of the invention improved the permeation resistance of the coated material compared to the uncoated plastic substrate. For example, a 120 nm diamond like carbon coating on both sides of a polycarbonate substrate reduced the hydrogen gas permeation of the underlying plastic by more than 10 times, in some embodiments by more than 100 times, and in still other embodiments by more than 300 times compared to the uncoated base polycarbonate substrate.

Polycarbonate (PC), Perfluoroalkoxy (PFA), polypropylene (PP), and Acrylonitrile butadiene styrene (ABS) were used as plastic or thermoplastic substrates for coating with the DLC or doped DLC coatings. PC film with 10 and 20 mil thickness (GE) were used and PFA film with 10 mil thickness (DuPont, Teflon 1000LP) was used. PP sheet with 57 mil thickness and ABS film with 20 mil thickness were purchased from McMaster. A silicon wafer was used as a substrate for outgassing and purity tests.

Figure 2A:
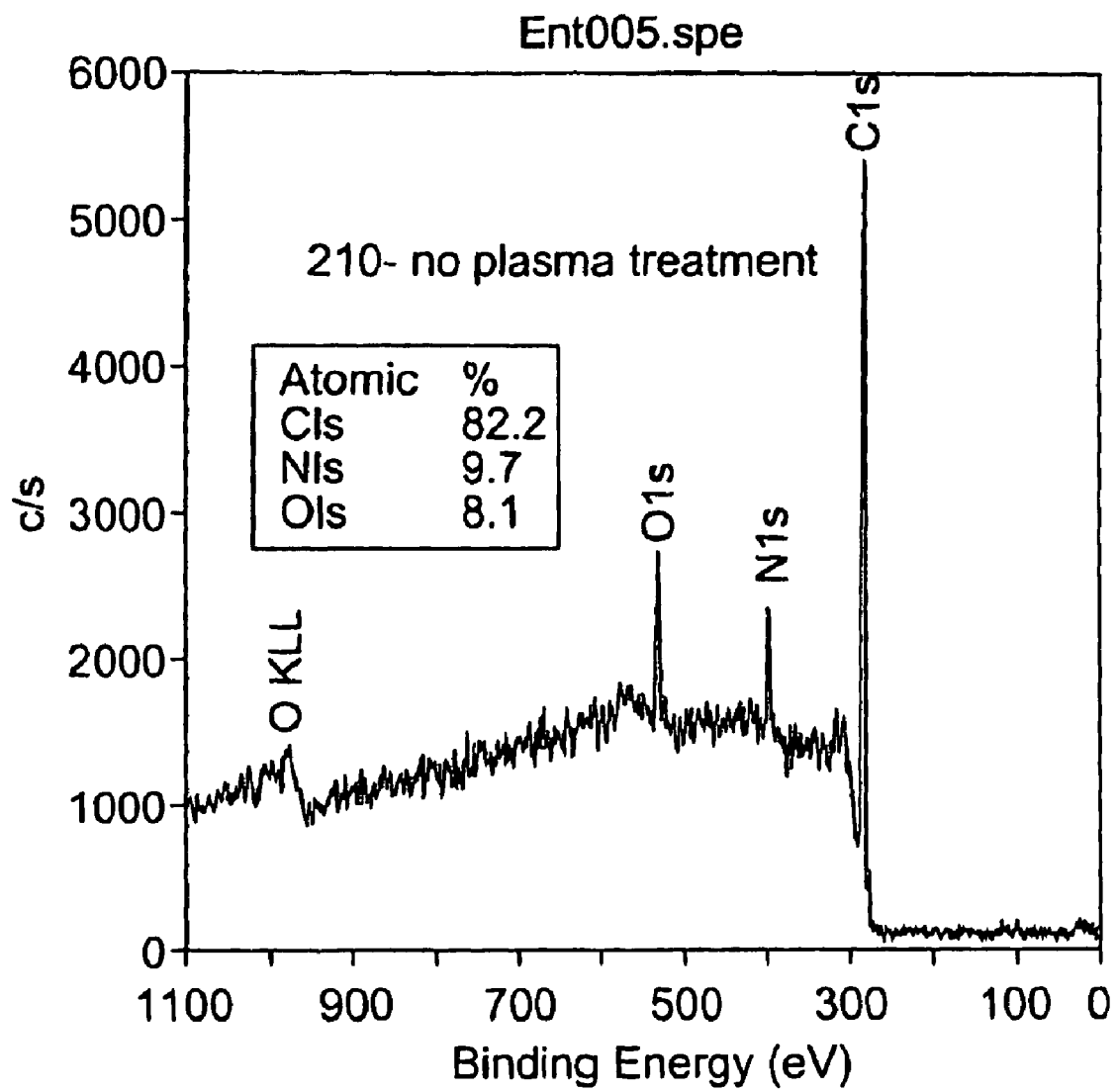
FIG. 2A is a XPS spectrum of a doped diamond like carbon coating on a polycarbonate film (untreated by plasma) and FIG. 2B illustrates a XPS spectrum of a doped diamond like carbon coating on a polycarbonate film (treated by plasma), the XPS spectra of these two samples shows a carbon peak at about 284 eV, an oxygen peak at about 532 eV, and a nitrogen peak at about 399 eV.
Figure 2B:
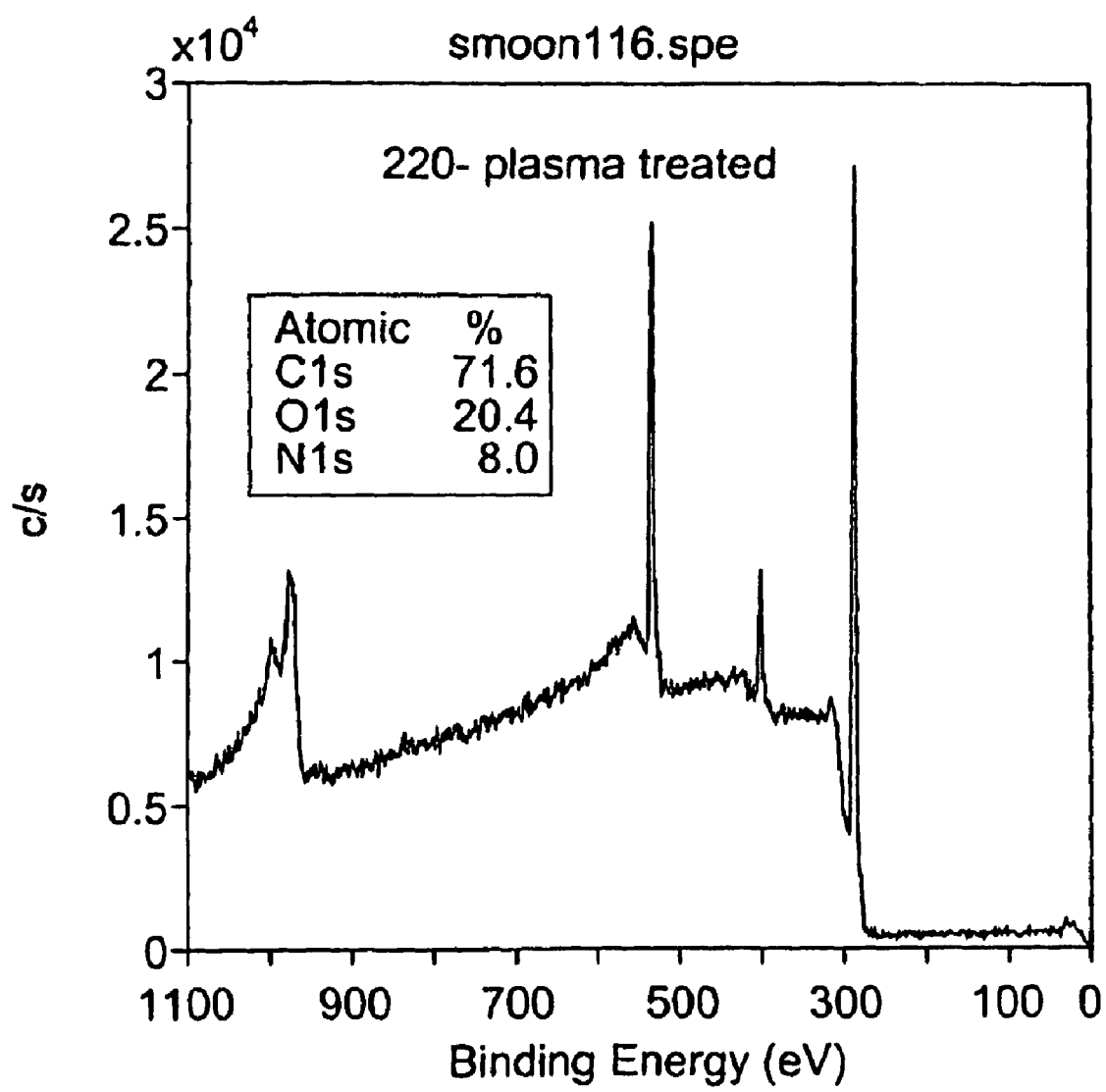
Figure 3A:
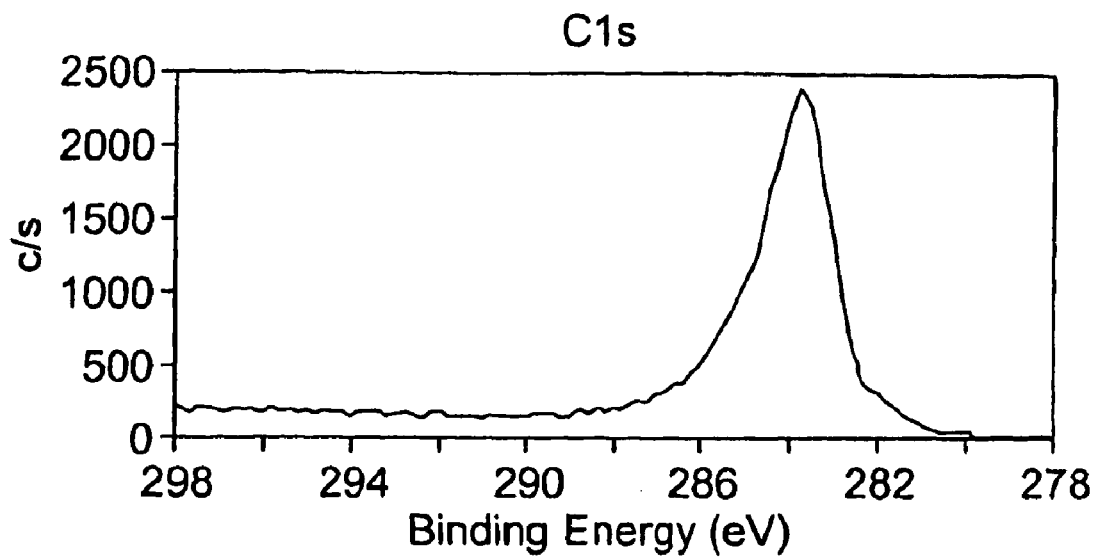
FIG. 3A-FIG. 3D illustrate XPS spectra of embodiments of the invention.
Figure 3B:
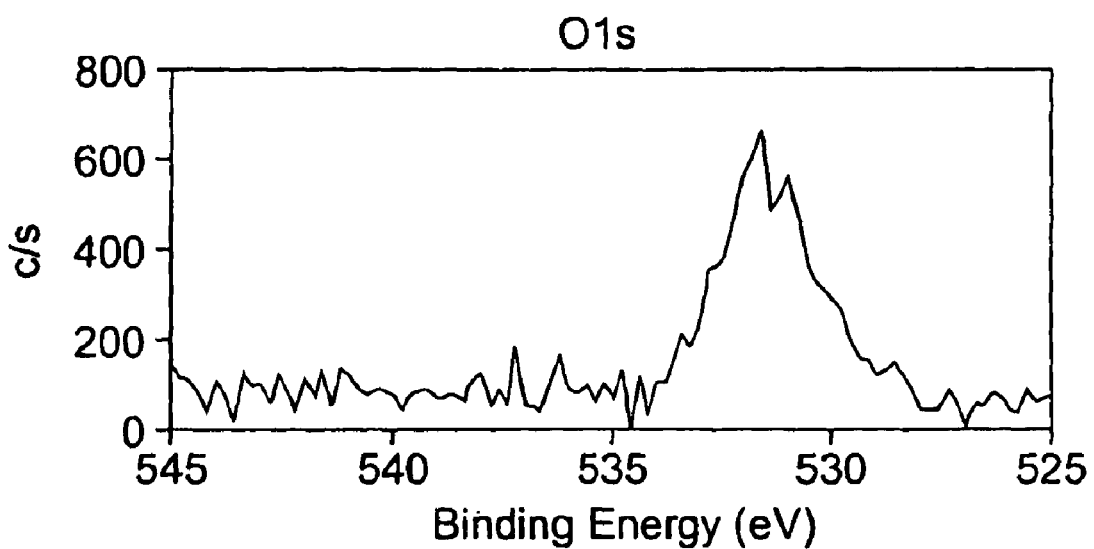
Figure 3C:
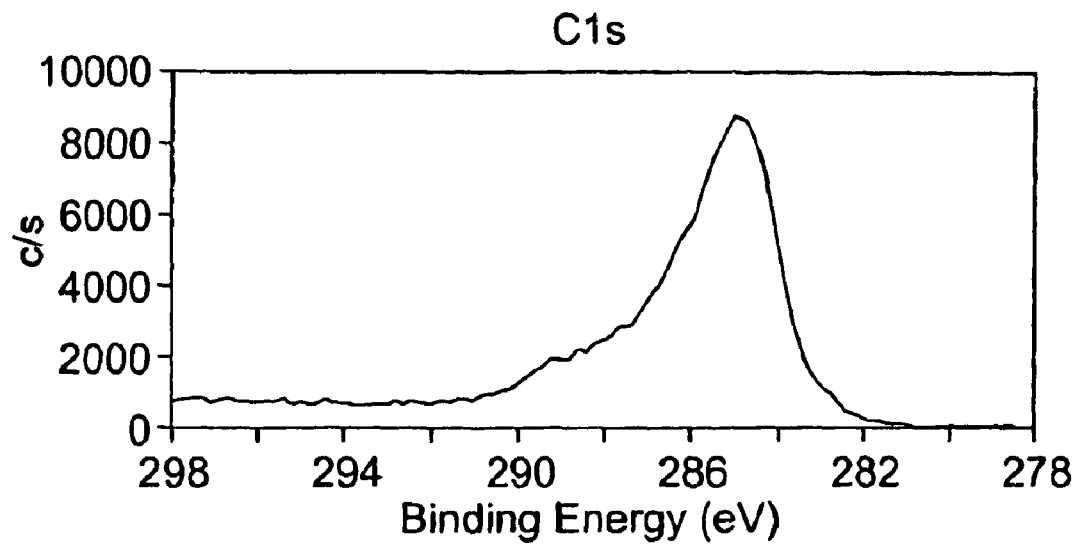
Figure 3D:
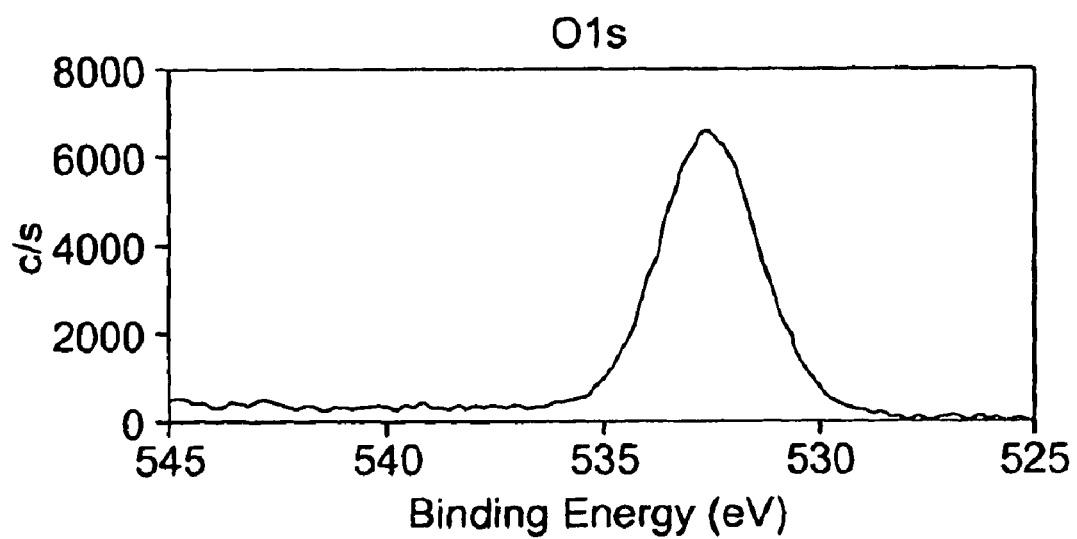

DLC coatings in embodiments of the invention can be prepared using a doping technology that incorporates controlled amounts of oxygen and nitrogen into the DLC coating. This coating process allows properties of the doped diamond like carbon coating, for example the electronic conductivity or resistivity, gas permeability, percent transmission to light, adhesion to the polymer, combinations of these properties, or other properties of the film to be modified. Embodiments of the diamond like carbon on a plastic in present invention can comprise or consist of oxygen, nitrogen, or a combination that includes any of these that provide a diamond like carbon coating or a doped diamond like carbon coating on a polymeric substrate whereby the coated substrate has a transmittance that ranges from about 0% to about 70% less (and values therein) than the percent transmittance of the underlying plastic substrate for light in the range of about 300 nm to about 1100 nm and where the surface resistivity of the doped diamond like carbon is in the range of from about $10^7$ ohm per square to about $10^{14}$ ohm per square and values therein and the gas permeation for hydrogen or helium gas is 0.59 Barrers to 0.03 Barrers or less, or from 0.15 Barrers to 0.03 Barrers or less. The DLC coatings that were doped to control resistivity, percent transmission, gas permeability and the like were made by Surmet, Burlington, Mass. These films had a composition whose percent atomic composition is illustrate in the XPS spectrum as shown in FIG. 2A. These films could be subsequently treated, for example but not limited to an oxygen plasma, as shown in FIG. 2B to provide higher oxygen content, as evidenced by the percent atomic composition and lower contact angle (see for example FIG. 2B and Table 5). Three different coatings were prepared. One film utilized 10 and 20 mil thick PC films as a plastic substrate. The target thickness for the DLC or doped DLC coating was 120 nm. The second film used PC and PFA as substrates and the target DLC or doped carbon coating thickness was 70 nm. The third run used PP and ABS as substrates and the target DLC or doped DLC thickness was 120 nm.

In some embodiments, the diamond like carbon coating is applied under conditions in which a portion or all of the coating adheres to the underlying plastic. The adhesion can include forces such as but not limited to covalent chemical bonds, or weaker bonds such as hydrogen bonds, dipole interaction, or van der Waals forces, or in some embodiments a combination of these. In embodiments of the invention the diamond like carbon or doped diamond like carbon coating is adherent or adheres to the underlying polymeric substrate when tape attached as a small strip on the DLC coated plastic does not result in transfer of the coating to the tape when the tape is removed. In some embodiments the plastic is a thermoplastic material. In other embodiments the thermoplastic is a polyester, polyolefin, a polyimide, polyetherimide, a perfluorinated thermoplastic, polysulfone, a polyetherether ketone, or other material suitable for a wafer, reticle, or other sensitive substrate container. In some embodiments the thermoplastic is polycarbonate. Alternatively, a material such as polyetherimide (PEI) could be used. PEI can provide better dimensional stability than PEEK at temperatures between 150° C. and 200° C. Polymers used in the bulk structure could be non-conductive (unfilled) or conductive (carbon powder, ceramic, etc.).

In some embodiments the plastic that is coated with DLC or doped DLC has a surface energy and roughness such that an integral film is formed exhibiting lower gas permeation coefficient than the underlying plastic. Non-limiting examples of such a material include polycarbonate, blends including polycarbonate, other polyesters, polyphosphonates, and the like with similar or higher surface energy.

Figure 6:
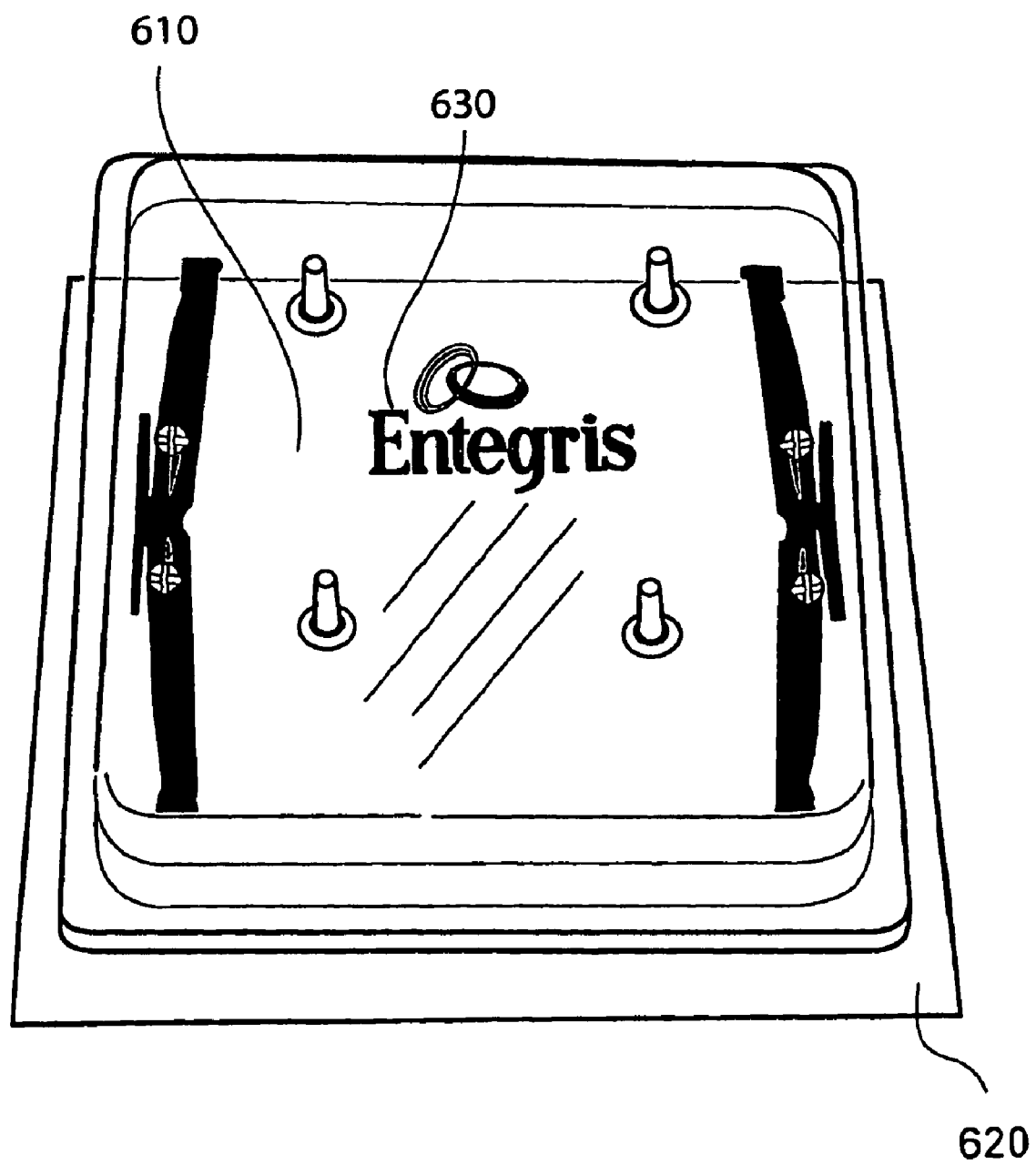
FIG. 6 illustrates a transparent coated reticle dome (610), which is a non-limiting example of a portion of a substrate carrier, that was coated on the inside surface of the dome with about 120 nm diamond like carbon in an embodiment of the invention; the coated surface has a surface resistivity of about $10^9$ ohms per square and appears lighter than the thicker diamond like carbon coating of FIG. 1; the text (630) on background (620) is visible through the transparent diamond like carbon coating on the surface of the dome (610) as illustrated.

One advantage of the DLC coatings, which includes doped DLC coatings, in embodiments of the invention versus other conductive coatings is their relative transparency. The DLC coatings in embodiments of the invention are sufficiently transparent that they can be seen through as illustrated in FIG. 1, or are sufficiently transparent that an operator in a semiconductor wafer manufacturing facility could under normal semiconductor fab lighting conditions determine whether a wafer or reticle enclosure within 1 to 10 meters that was coated with the DLC or doped DLC coating in embodiments of the invention contained wafers, reticles, or other environmentally sensitive substrates or materials. FIG. 1 illustrates the transparency of a doped DLC coating in an embodiment of the invention on a polycarbonate (PC) film. A two inch diameter disk of DLC coated PC was laid over the right half of a logo (110) as shown in FIG. 1. Even though the diamond like carbon coating (130) adherent on the polycarbonate substrate (120) in this embodiment had a yellow brown or brown hue, the portion of the logo (110A) below the diamond like carbon coating region (130) was still clearly visible which illustrates that the diamond like carbon coating (130) was transparent. The coating films in embodiments of the invention can have other hues and remain transparent. For example, the hue can range from light yellow to a light brown hue; other colors and hues are possible. The hue and transparency allow a worker to visually check the contents of a device handling case under ambient fab lighting conditions for one or more substrates such as reticles or wafers. An example of such a coating on a plastic substrate used as part of an enclosure is illustrated in FIG. 6. In this example the coating is similar to that of FIG. 1, however it is only about 120 nm thick and is applied only to the surface closest to the printed text (630). Visually the embodiment in FIG. 6 is lighter than the embodiment in FIG. 1.

The diamond like carbon coating or doped diamond like carbon coating thickness can be measured using a test coupon that is partially masked that had been placed in the same coating chamber as the plastic substrate to be coated. The thickness of the coating can be determined by profilometry. Two different coating thickness were produced, 120 nm and 70 nm, however embodiments of the invention are not limited to this range or these particular values. Other doped film DLC compositions of different thickness can be made and used provided the films reduce the gas permeability of the substrate, have ESD properties sufficient to protect wafers, reticles, or other static sensitive devices, have sufficient transparency, or any combination of these. The amount of each dopant such as nitrogen or oxygen in the film can be changed to meet the application requirements. Films can be applied to portions of the carriers, the entire carrier, or to one or more sides. The thickness and composition of the DLC or doped DLC coating is not limited and can chosen to provide a hydrogen gas permeation coefficient, percent transmittance to light, a surface resistivity, a surface resistivity uniformity or any combination of these as described herein. In some embodiments the coating thickness can be 1 micron or less, in other embodiments 250 nm or less, in other embodiments 120 nm or less, and in still other embodiments 70 nm or less.

Dopants which can be used in the DLC films can include or consist of nitrogen, oxygen, or combinations of these. The amounts of oxygen and nitrogen incorporated into the doped DLC coating can be modified during the coating process by the amount of nitrogen and or oxygen containing precursor gases introduced into the coating apparatus. The composition of the coating can be determined by XPS and the properties of the doped diamond like carbon coating on the polymer measured, for example the electronic conductivity or resistivity, gas permeability, percent transmission to light, or adhesion of the coating to the polymer. The electrical properties can be varied with dopant and amount of dopant in the film.

Surface resistance of the DLC or doped DLC films on plastic substrates in embodiments of the invention can be measured using surface resistance meter such as a Monroe Electronics 262A surface resistance meter. For PC samples, the first run sample (120 nm both sides) showed about $10^{11}$ ohm/square surface resistivity and the second run (70 nm both sides) sampled showed about $10^9$ ohm/square surface resistivity. In some embodiments the surface resistivity can range from about $10^7$ to about $10^{13}$ ohm per square. For PFA and ABS samples, two sides showed different surface resistances and depended on the surface roughness of the sample. Smooth surfaces showed lower surface resistance. PFA showed $10^{11}$ and $10^{12}$ ohms/sq. The PP sample showed $10^{12}$ ohm/sq on both sides. The thickness of the film as well as the composition of the dopants in the DLC film can be modified to change the surface resistivity into the range of from about $10^4$ to about $10^{14}$ ohms/square.

The polymeric surface condition can be used to modify the morphology of the DLC coating. The morphology of the DLC films can be examined using optical microscopy. PP, PFA, and ABS substrates were rough and DLC coated substrates were observed have many crack-like features on the surface which might be introduced during the coating process. The PC substrate was very smooth and the DLC coated PC substrate provided a smooth DLC coating.

Figure 4:
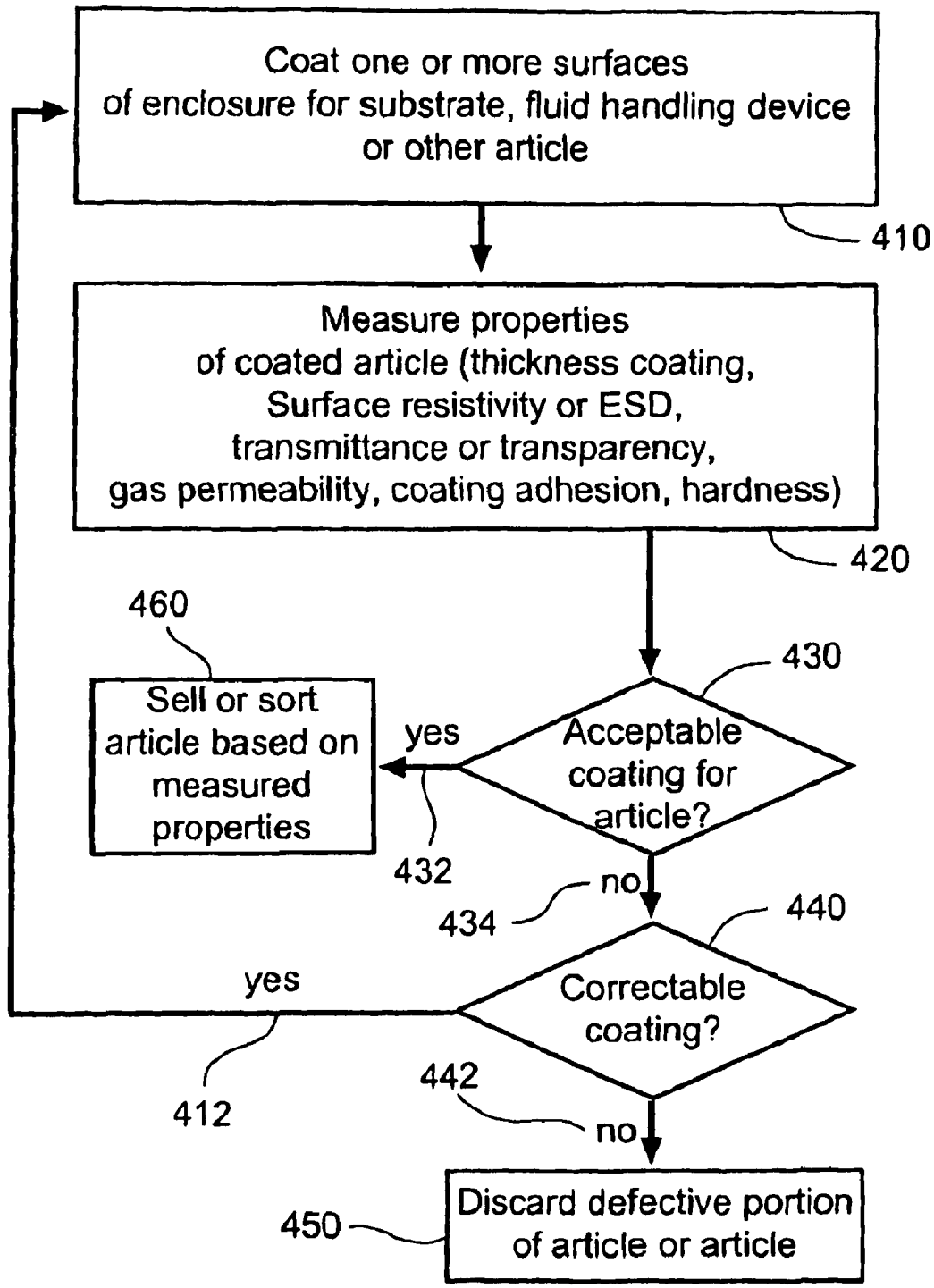
FIG. 4 illustrates a non-limiting flow chart describing a method in an embodiment of the invention.

FIG. 4 illustrates a non-limiting flow chart describing a method in an embodiment of the invention. The method can include coating (410) one or more surfaces of an enclosure or a fluid handling device with a diamond like carbon coating or a doped diamond like carbon coating and measuring (420) the properties of the coating such as coating thickness, surface resistivity or electrostatic dissipative property, percent transmittance of light, gas permeability, coating adhesion, hardness, or any combination of these. Based on the testing, the acceptability of the coating on the enclosure or fluid handling device for a particular use is determined (430). If the coating is acceptable for the use (432) the article can be sold or sorted (460) based on the results of the measurement. In some embodiments the articles can be sorted based on whether one or more properties measured are within 1%, 2%, 5%, 10%, or more of the target values for each of the measured properties. For example the customer requirement for percent transmittance to 600 nm light may be 60±2% and permeation coefficient for helium of 0.05±10% Barres. After coating, those articles having 60±2% transmission and permeation coefficient for helium of 0.05±10% Barres can be grouped for sale; those having higher transmission and or permeability can be grouped for further coating. In some embodiments the articles can be sorted based on whether the one or more properties are within a factor of 10, 100, 1000, or more of the other articles coated. For example the surface resistivity target value for the coated article may be $10^9$ ohms/square but those within a factor of 100 or having a surface resistivity of $10^7$ ohms/square to $10^{11}$ ohms/square would be acceptable for the use (432) and the article can be sold or sorted (460) based on the results of this measurement. In other embodiments the articles can be sorted on their surface resistivity into bins ranging for example but not limited to $10^7$ to $10^8$ ohms/square, $10^9$ to $10^{10}$ ohms/square, and $10^{11}$ to $10^{12}$ ohms/square. If the coating is not acceptable (434), a determination can be made to correct the coating (440). If the coating can be corrected the article can be recoated (412). If the article coating cannot be corrected (442), the part or portion of the article can be discarded (450)

Figure 7:
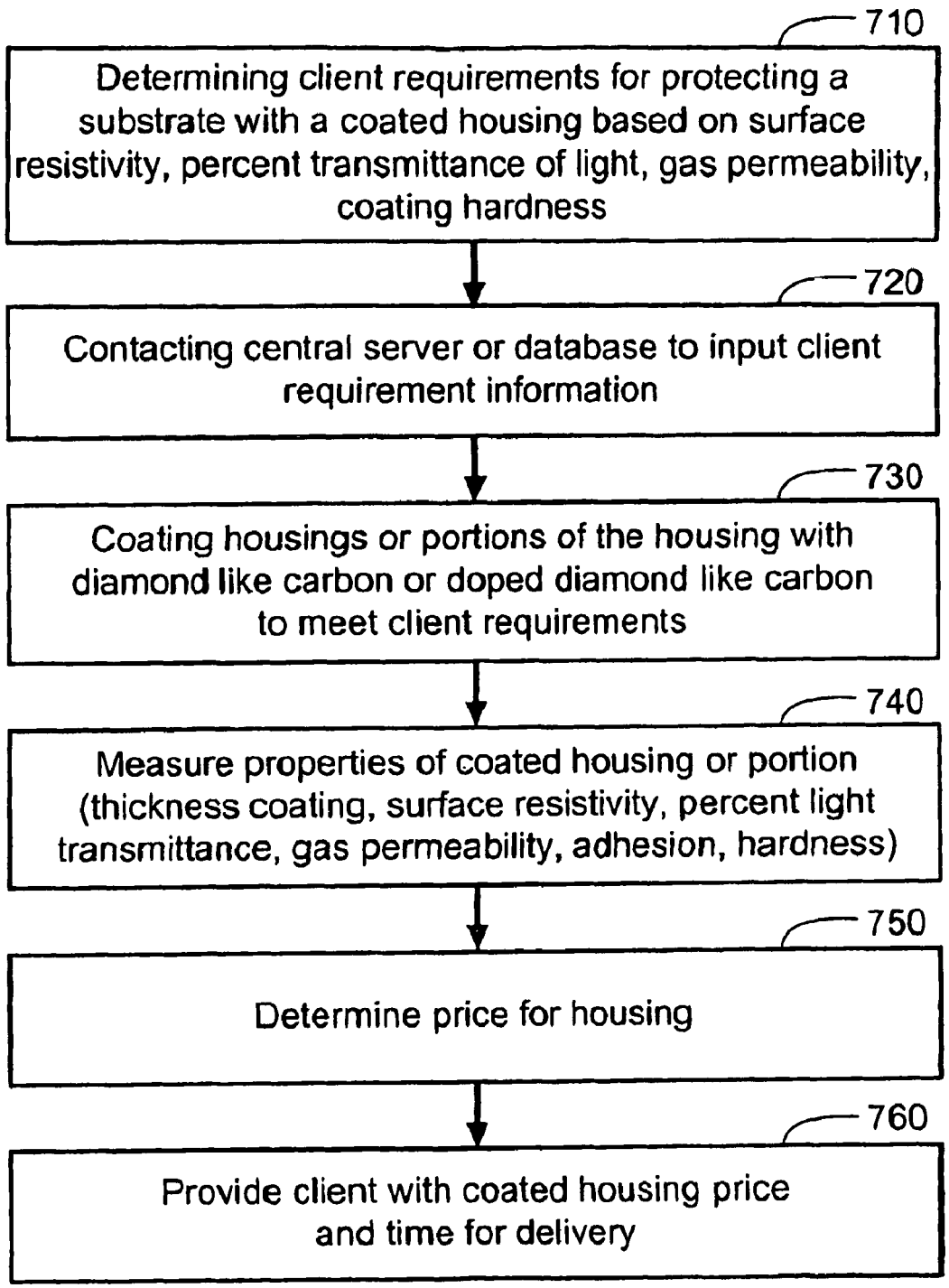
FIG. 7 illustrates a non-limiting flow chart describing a method in an embodiment of the invention.

FIG. 7 illustrates a non-limiting flow chart describing a method in an embodiment of the invention. The method includes determining (710) client or end user requirements for protecting a substrate with a coated housing based on the ESD or surface resistivity, percent transmittance of light, gas permeability, coating hardness or any combination of these. The method can further include the step of contacting (720) a central server/database to input the information for the client's requirements, and coating (730) the housings with a diamond like carbon coating or a doped diamond like carbon coating to meet the client requirements. Measuring (740) the properties of the coated housing or coated portions of the housing. The method can optionally further include the step of determining (750) a price for the coated housings and optionally providing (760) the client with a price and time for delivery of the coated housing(s).

Table 1 summarizes the gas permeation properties of doped DLC coated PC samples in some embodiments of the invention. A 10 mil PC film with 120 nm doped DLC coating on both sides, about 240 nm total doped DLC coating as characterized by the XPS of FIG. 2A (untreated), was used as a sample for the gas permeation tests. For comparison, the gas permeation properties of uncoated PC film were also measured. The doped DLC coating layer on the polymer improved the permeation resistance properties of the PC film by more than 10 times, in some cases more than 80 times, in some cases more than 170 times, and in still other cases by more than 350 times while maintaining transparency and surface resistivity useful for ESD (electrostatic charge dissipation; for example surface resistivity in the range of $10^7$ to $10^{14}$ ohm/square. The gas permeation test on DLC coated PFA film was tried and showed no improvement which suggests that under the coating conditions used, open channels for gas were present in the coating layer in these embodiments. The crack-like features in microscopy are thought to be the open channels. As shown in Table 1 for the 10 mil thick polycarbonate film with 120 nm DLC coating on both sides, in the case of $H_2$ gas, the permeability at 3 atmospheres decreased by 179.9 times versus the uncoated PC film; for He gas at 6 atmospheres pressure the permeability decreased by 84 times for the doped diamond like carbon coated PC substrate in an embodiment of the invention compared to the uncoated polycarbonate film.

The doped DLC films on a plastic in embodiments of the invention have better gas permeation resistance (smaller gas permeation coefficient) compared to the uncoated substrate. The gas permeation resistance is better than other reported diamond like carbon coatings. For example in U.S. Pat. No. 6,805,931 FIG. 12, polyacrylonitrile was reported to be coated with 231.5 nm and 400 nm DLC; the gas permeability to oxygen decrease by 33.8 times and the $CO_2$ permeability decreased by 37.4 times for the two films respectively compared to the polyacrylonitrile plastic uncoated.

TABLE 1

The gas permeability of the DLC coated PC film.

| DLC coated PC | H2 3 atm | He 3 atm |
|---|---|---|
| Permeability coefficient: | 0.0591 (Barrers)** | 0.0602 (Barrers)** |
| Diffusion coefficient: | 0.4070 ($10^{-8}$ cm$^2$/s) | 0.3659 ($10^{-8}$ cm$^2$/s) |
| Solubility coefficient: | 0.0015 (cm$^3$/cm$^3$ · cmHg) | 0.0016 (cm$^3$/cm$^3$ · cm Hg) |
| | H2 6 atm | He 6 atm |
| Permeability coefficient: | 0.0585 (Barrers)** | 0.1187 (Barrers)** |
| Diffusion coefficient: | 0.3778 ($10^{-8}$ cm$^2$/s) | 1.6924 ($10^{-8}$ cm$^2$/s) |
| Solubility coefficient: | 0.0015 (cm$^3$/cm$^3$ · cm Hg) | 0.0007 (cm$^3$/cm$^3$ · cm Hg) |
| PC | H2 3 atm | He 6 atm |
| Permeability coefficient: | 10.6300 (Barrers)** | 10.0200 (Barrers)** |
| Diffusion coefficient: | 157.1322 ($10^{-8}$ cm$^2$/s) | 506.2420 ($10^{-8}$ cm$^2$/s) |
| Solubility coefficient: | 0.0007 (cm$^3$/cm$^3$ · cm Hg) | 0.0002 (cm$^3$/cm$^3$ · cm Hg) |

A replicate test for the 120 nm diamond like carbon film of FIG. 2A (untreated—i.e. no plasma treatment) on both sides of a 10 mil PC film measured a permeation coefficient for $H_2$ of 0.03 (Barrers); in this embodiment the permeability coefficient was about 350 times less than the permeability coefficient of the uncoated PC film for $H_2$ gas. Permeation coefficients were also determined in replicate measurements on PC films coated on both sides with about 70 nm of doped diamond like coating; the permeation coefficients measured were about 0.06 and about 0.03 (Barrers).

The permeation coefficient was measured on a 13.66 cm$^2$ coated sample of material at about 25° C. The high pressure side was 223 mmHg; pressure increase on the downstream side of the film was measured over about 3.5×10$^5$ sec.

Diamond like carbon coatings described in embodiments of the present invention, for example DLC, doped DLC, combinations of these, plasma modified versions of these, may also be used for coating heat exchanger hollow tubes, fluid handling components, wafer handling systems, reticle handling products.

The diamond like coatings on plastic substrates in embodiments of the invention show good adhesion and the coatings may be used as an intermediate layer for further surface treatments like plasma derivitization. For example to measure adhesion of the coating, Magic™ tape from 3M could be attached as a small strip of about (1×1 cm) on the DLC coated films and rubbed using a gloved finger to remove any entrapped air. The tape could be peeled off the DLC film and the amount of DLC coating transferred to the tape measured. From DLC coated PC, there is no noticeable amount of the coating on the tape (visual inspection). For ABS, the adhesion is quite good and almost the same as PC. The PFA showed a little bit poor adhesion (~10% transfer) and PP showed even higher transfer. PP substrate has quite different surface roughness on each side. From rougher side, almost 50% of the coating was transferred to the tape and from smooth side less than 10%.

The diamond like carbon coated plastics in embodiments of the invention are chemically stable. For example, small strips of DLC coated PC film (20 mil thickness film with 120 nm DLC coating on both sides) were cut (5 mm width and 2.5 cm length). One piece was rubbed with a IPA soaked lab tissue (Kimwipes) about ten times. A cross mark was added to one end of the strip by a razor blade and the sample was placed in 10 mL of IPA for three days. In another test, two pieces were placed in 10 mL of water and 1% surfactant (Alfonic A10) solution of water respectively. Both were boiled for 2 min using a lab microwave. Two samples stayed in the same liquid for three days. The three samples were taken out and rinsed with water and wiped to dry. Surface resistances were measured and all showed the same surface resistance before the test. ($10^{11}$ ohm/square). Tape tests were done using a 3M Magic™ tape as described previously and none of the coating (visual inspection) was transferred to the tape.

An Si wafer was used as a substrate for the DLC coating purity test; Si wafers are known to be very clean and so the purity of the overlying coating could be measured in this way.

For outgassing organics, each wafer was placed in a clean dish with a Tenax tube and allowed to stand for 7 days at room temperature. A Tenax tube was also placed in an empty dish to provide a background blank for the experiment.

The total outgassing organics measured for the DLC coated wafer did not differ significantly from the uncoated control wafer. Major organic species (or generic classes of organic species) detected for both samples were ketones and aliphatics. Only three species were observed in the DLC coated wafer that were not observed in the uncoated control wafer. These included a siloxane and nitrogen-containing compound. Table 2 shows the results.

TABLE 2

Outgassing organics.

| Category Parameter Chemical | Units | Test Method | Uncoated Wafer (Control) | DLC Coated Wafer |
|---|---|---|---|---|
| Outgassing Organics (ATD-GC/MS) | Σ µg | FGTM 1350 (7 Day, RT) Tenax TA | 4.6 | 4.7 |

Sample preparation for anions and metals analysis of the wafers or coated wafers was performed by placing 25 ml aliquot of ultrapure DI water into a clean, pre-leached container and then drawing up the aliquot with a pipette and rinsing the appropriate side of the wafer three times. The rinse procedure was performed separately for each wafer. The resulting rinse for each wafer was split, with one portion analyzed for anions via ion chromatography, and the other portion acidified and analyzed for metals via inductively coupled plasma mass spectrometry (ICP/MS).

Anions detected for the DLC coated wafer were not significantly different than those detected for the uncoated control wafer. The uncoated control wafer revealed low levels of only nitrate and sulfate, while the DLC coated wafer exhibited low levels of only nitrate. All other anions for both samples were below detection limit.

TABLE 3

Aqueous rinse anions.

| Category Parameter Chemical Aq. Rinse Anions (IC) | Units | Test Method 25 mL Rinse | Uncoated Wafer (Control) | DLC Coated Wafer |
|---|---|---|---|---|
| Acetate | ng | d.l. <200 | dl | dl |
| $Br^-$ | ng | d.l. <25 | dl | dl |
| $Cl^-$ | ng | d.l. <25 | dl | dl |
| $F^-$ | ng | d.l. <25 | dl | dl |
| $HCO^-$ | ng | d.l. <100 | dl | dl |
| $NO_2^-$ | ng | d.l. <25 | dl | dl |
| $NO_3^-$ | ng | d.l. <25 | 35 | 49 |
| $SO_4^{2-}$ | ng | d.l. <25 | 38 | dl |
| Phthalate | ng | d.l. <25 | dl | dl |
| $PO_4^{3-}$ | ng | d.l. <25 | dl | dl |

Trace metals analysis for the DLC coated wafer and the uncoated control wafer showed a lack of aqueous rinse trace metals in both samples. The only trace metal observed in either sample was nickel at 19 ng in the uncoated control wafer. All other trace metals for both samples were below detection limit.

The doped DLC films in embodiments of the present invention outgas within 2% of the base substrate, and can have ion and metals content at or below those measured in Tables 3 and 4.

TABLE 4

Aqueous rinse trace metals.

| Category Parameter Chemical Aqueous Rinse Trace Metals (ICP-MS) | Units Σ ng | Test Method 25 mL Rinse | Uncoated Wafer (Control) 19 | DLC Coated Wafer 0 |
|---|---|---|---|---|
| Ag | ng | | 11 | dl | dl |
| Al | ng | | 5.5 | dl | dl |
| As | ng | | 7.0 | dl | dl |
| Au | ng | | 40 | dl | dl |
| B | ng | | 18 | dl | dl |
| Ba | ng | | 9.8 | dl | dl |
| Be | ng | | 7.3 | dl | dl |
| Bi | ng | | 9.5 | dl | dl |
| Ca | ng | | 9.3 | dl | dl |
| Cd | ng | | 9.0 | dl | dl |
| Co | ng | | 2.8 | dl | dl |
| Cr | ng | | 4.3 | dl | dl |
| Cu | ng | | 3.3 | dl | dl |
| Fe | ng | | 9.0 | dl | dl |
| Ga | ng | | 8.0 | dl | dl |
| Ge | ng | | 8.0 | dl | dl |
| Hg | ng | | 11 | dl | dl |
| K | ng | | 11 | dl | dl |
| Li | ng | | 4.5 | dl | dl |
| Mg | ng | | 8.3 | dl | dl |
| Mn | ng | | 4.5 | dl | dl |

TABLE 4-continued

Aqueous rinse trace metals.

| Category Parameter Chemical Aqueous Rinse Trace Metals (ICP-MS) | Units Σ ng | Test Method 25 mL Rinse | Uncoated Wafer (Control) 19 | DLC Coated Wafer 0 |
|---|---|---|---|---|
| Mo | ng | 7.5 | dl | dl |
| Na | ng | 14 | dl | dl |
| Nb | ng | 6.0 | dl | dl |
| Ni | ng | 3.8 | 19 | dl |
| Pb | ng | 10 | dl | dl |
| Pt | ng | 9.0 | dl | dl |
| Sb | ng | 7.3 | dl | dl |
| Sn | ng | 8.3 | dl | dl |
| Sr | ng | 8.8 | dl | dl |
| Ta | ng | 7.8 | dl | dl |
| Ti | ng | 11 | dl | dl |
| Tl | ng | 9.8 | dl | dl |
| V | ng | 7.5 | dl | dl |
| Zn | ng | 8.0 | dl | dl |
| Zr | ng | 7.8 | dl | dl |

The hardness of the doped DLC films in embodiments of the invention can be measured by pencil hardness (ASTM D3363). It is a hardness measurement that has been used for paint and coating. It involves scratching the surface using various lead grades and determining the weakest lead making a scratch in the surface. Human fingernail has a hardness of around 2H and this method is good for measuring the scratch resistance of a surface.

The hardness of the doped DLC films in embodiments of the invention approximate those of the underlying polymeric substrate. Films are so thin that mechanical properties are dominated by the mechanical properties of the underlying substrate by gross deformation. For example, a DLC layer on PC film is so thin and the PC film is quite soft, around 2B, that a pencil hardness test results in failure of the DLC film due to the soft underlying PC film. In contrast, a DLC of the present invention coated on an Si wafer was a good sample for measuring the hardness of the DLC film; the DLC layer on Si wafer is harder than 8H.

The DLC coating layer surface can be modified because it has a carbon structure on the surface. The doped DLC structure is a network that has a diamond like carbon and graphite structure. The surface treatment is stable, which means it does not change much according to the time as shown in Table 5. In some embodiments the surface treatment results in a contact angle that is 30 degrees to 40 degrees less than the contact angle with water of the untreated substrate after 3 weeks in ambient air; in other embodiments the surface treatment results in a contact angle that is 25 degrees to 40 degrees less than the contact angle with water of the untreated substrate after 10 weeks in ambient air; in still other embodiments the surface treatment results in a contact angle that is 20 degrees to 30 degrees less than the contact angle with water of the untreated substrate after 16 weeks in ambient air. Without wishing to be bound by theory, the stability of the contact angle of the chemically modified doped DLC films may be due to the functional groups on the surface not having enough mobility for surface rearrangement, the organic or other contaminants from the underlying substrate cannot mask the surface groups, or a combination of these.

The DLC coating can be modified by a plasma treatment. For example; a DLC coating of FIG. 2A was subsequently treated by an oxygen plasma treatment method and the contact angle change was measured over time. Table 5 shows the result; the water spread right after the treatment and the contact angle increased over the time but did not recover completely within the time range studied. FIG. 2B (treated) characterizes the plasma modified film by XPS.

TABLE 5

Contact angle change of the surface treated DLC coating.

|  | DLC on Si wafer | DLC on PC |
|---|---|---|
| Untreated | 65 ± 5 | 65 ± 5 |
| After treatment | spread | spread |
| After 3 weeks (in the air) | 25 ± 8 | 32 ± 4 |
| After 10 weeks (in the air) | 25 ± 8 | 40 ± 3 |
| After 16 weeks (in the air) | 35 ± 3 | 45 ± 2 |

XPS analyses of a doped DLC film coated on polycarbonate, spectra (210) in FIG. 2A, and an oxygen plasma treated doped DLC film coated on polycarbonate, spectra (220) in FIG. 2B, were performed. The amount of oxygen was increased by the oxygen plasma surface treatments as illustrated by the increase in the intensity of the O 1s peak near 534 eV from (210) to (220) and by the difference in the atomic percent ratios for the two spectra. In XPS spectra of the untreated diamond like carbon coating (210) the atomic percent (%) of carbon (C1s) is 82.2%; for nitrogen (N1s) it is 9.7%; for oxygen (O1s) it is 8.1%. In the treated diamond like carbon coating in the embodiment illustrated in spectra (220), the atomic percent (%) of carbon (C1s) is about 71.6%; for nitrogen (N1s) it is about 8.0%; for oxygen (O1s) it about 20.4%. The atomic ratios are not limited to these and can varied by changing the deposition or subsequent treatment time as well as the mixture of gases or reagents used to deposit the coating and or to subsequently treat the coating surface. The oxygen and nitrogen in the untreated sample may be due to the doping process of the doped DLC coating.

DLC coatings in embodiments of the invention may be used on fluid handling parts to reduce static charge. For example, such a coating may help in reducing static charge build-up on a spray nozzle or perfluorinated tubing used in wafer manufacturing or heat exchangers. In these embodiments the coating can have a surface resistivity that provides static dissipation, a surface resistivity in the range of from about $10^7$ ohm per square to about $10^{14}$ ohm per square, but the gas permeation coefficient can be similar to about 0.1 times the permeability of the underlying polymer.

PC has the one higher surface energy out of the polymers used because it has more polar groups, hydroxides, carbonyl, and the like. It may be possible to pretreat other polymers with plasma to provide them with a higher surface energy and provide similar bonding (Van der vaals, H bonding). The DLC coating can also be used as an initial layer for further surface treatment because the surface can be modified using various methods and the treated surfaces show a long service time. Optionally the surface of the plastic material can be activated to enhance adhesion of the diamond like carbon coating to the plastic. For example, the plastic surface may be activated by a plasma with an inorganic gas such as but not limited to argon or oxygen gas, or other suitable gas ($Cl_2$, water, $NH_3$, air, nitrogen).

The uniformity of the coating can vary by less than about 50% across the substrate, in some embodiments less than about 10%. The less variation the more uniform the surface resistivity (ESD) and gas permeation resistance or gas permeability coefficient.

The DLC coatings in embodiments of the invention can be made by a vapor phase deposition. In some embodiments the temperature of the substrate can be controlled to reduce thermal stress and differential thermal expansion between the coating and substrate during and following the deposition process. This can provide improved gas permeation resistance and more uniform ESD. In some embodiments the substrate can be coated below a temperature of about 70° C.

Various portions of wafer carrier surfaces, for example where control of ESD or where diffusion or permeation of contaminants into the wafer carrier is an issue, can be coated in embodiments of the invention. Different parts of the carrier can be coated with different amounts of coating to tailor the ESD properties, transparency, or other properties. Wafer carriers, FOUPS, wafer shippers, and other similar substrate carriers for environmentally sensitive materials can be DLC or doped DLC coated. Such carriers can be prepared by the methods and materials such as but not limited to those disclosed in U.S. Pat. No. 5,255,783, the contents of which are incorporated herein by reference in their entirety. Various portions of reticle pod surfaces where control of ESD or where diffusion or permeation of contaminants into the reticle pod is an issue can be coated in embodiments of the invention. Different parts of the reticle pod can be coated with different amounts of coating to tailor the ESD properties and transparency. Reticle pods can be prepared by the methods and materials such as those disclosed in U.S. Pat. No. 6,338,409 or U.S. Pat. No. 6,498,619, the contents of which are incorporated herein by reference in their entirety. Portions of carriers can be coated with different amounts of DLC coating, doped DLC coating, or modified versions of these coatings to protect the environmentally sensitive substrates from electrostatic discharge, light catalyzed or light driven reactions.

Although the present invention has been described in considerable detail with reference to certain preferred embodiments thereof, other versions are possible. DLC and doped DLC coatings in embodiments of the invention have quite unique properties such as low friction coefficient, high scratch resistance, high barrier properties and good thermal conductivity. Chip trays, matrix tray, and test sockets can have all or a portion of their surfaces coated with the coatings of the present invention. Wafer handling product (low friction reduces particle generation, low permeation improves the bad effect due to oxygen and water). For polymeric heat exchangers (good thermal conductivity improves the performance and low permeation reduces the diffusion of dangerous chemical vapor such as HF and HCl) a DLC coating layer can be applied to outside and/or inside of heat exchanger hollow fiber depending on the chemical compatibility. In fluid handling system and components, low permeation decreases the leak of dangerous chemical and vapor. Base coating for further surface modification (DLC can be modified by various technique including plasma treatment). Embodiments of DLC, doped DLC, or treated versions of these can be applied to liquid and/or gas filtration membranes to control permeation, thermal conductivity and/or surface properties Therefore the spirit and scope of the appended claims should not be limited to the description and the preferred versions contain within this specification.

What is claimed is:

1. An article comprising:
a thermoplastic and an adherent diamond like carbon coating on one or more surfaces of said thermoplastic, said adherent diamond like carbon coating has a gas permeation coefficient for helium of 0.59 Barrers or less, the diamond like carbon coating has a surface resistivity of from about $10^7$ to about $10^{14}$ ohm/square and said adherent diamond like carbon coating has a transmittance that is 0% to 70% less than the transmittance of said thermoplastic to light in the range of 300 nm to 1100 nm, wherein the article is a carrier for a substrate used in semiconductor manufacturing.

2. The article of claim 1 where the adherent diamond like carbon coating is a doped diamond like carbon that further comprises nitrogen or oxygen.

3. The article of claim 1 where the surface resistivity of the adherent diamond like carbon coating provides a surface resistivity in the range of $10^8$ ohm per square to $10^{12}$ ohm per square.

4. The article of claim 1 where the surface resistivity of the adherent diamond like carbon coating provides a surface resistivity in the range of $10^9$ ohm per square to $10^{12}$ ohm per square.

5. The article of claim 1 where the adherent diamond like carbon coating has a variation of surface resistivity that is less than $10^2$ ohm per square.

6. The article of claim 1 where the adherent diamond like carbon coating has a variation of surface resistivity that is less than $10^1$ ohm per square.

7. The article of claim 1 where the adherent diamond like carbon coating has an X-ray Photoelectron Spectroscopy spectra that has a carbon peak, an oxygen peak, and a nitrogen peak.

8. The article of claim 7 where the X-ray Photoelectron Spectroscopy spectrum of said adherent diamond like carbon coating includes a carbon peak at about 284 eV, an oxygen peak at about 532 eV, and a nitrogen peak at about 399 eV.

9. The article of claim 1 where the adherent diamond like carbon coating comprises a hydrophilic adherent diamond like carbon coating.

* * * * *

UNITED STATES PATENT AND TRADEMARK OFFICE
CERTIFICATE OF CORRECTION

| | | |
|---|---|---|
| PATENT NO. | : 8,012,586 B2 | Page 1 of 1 |
| APPLICATION NO. | : 12/515606 | |
| DATED | : September 6, 2011 | |
| INVENTOR(S) | : Charles W. Extrand et al. | |

It is certified that error appears in the above-identified patent and that said Letters Patent is hereby corrected as shown below:

Column 9, line 16 delete "Barres" and replace with "Barrers"

Column 9, line 18 delete "Barres" and replace with "Barrers"

Signed and Sealed this
Eighteenth Day of October, 2011

David J. Kappos
*Director of the United States Patent and Trademark Office*